(12) United States Patent
Chao et al.

(10) Patent No.: US 9,774,337 B1
(45) Date of Patent: Sep. 26, 2017

(54) HIGH SPEED SAR ADC USING COMPARATOR OUTPUT TRIGGERED BINARY-SEARCH TIMING SCHEME AND BIT-DEPENDENT DAC SETTLING

(71) Applicants: Yuan-Ju Chao, Cupertino, CA (US); Ta-Shun Chu, Hsinchu (TW)

(72) Inventors: Yuan-Ju Chao, Cupertino, CA (US); Ta-Shun Chu, Hsinchu (TW)

( * ) Notice: Subject to any disclaimer, the term of this patent is extended or adjusted under 35 U.S.C. 154(b) by 0 days.

(21) Appl. No.: 15/594,260

(22) Filed: May 12, 2017

(51) Int. Cl.
| | |
|---|---|
| *H03M 1/06* | (2006.01) |
| *H03M 1/10* | (2006.01) |
| *H03K 5/24* | (2006.01) |
| *H03K 5/00* | (2006.01) |
| *H03M 1/00* | (2006.01) |
| *H03M 1/12* | (2006.01) |

(52) U.S. Cl.
CPC ............... *H03M 1/06* (2013.01); *H03K 5/24* (2013.01); *H03M 1/1071* (2013.01); *H03K 2005/00058* (2013.01); *H03M 1/00* (2013.01); *H03M 1/12* (2013.01)

(58) Field of Classification Search
CPC .................................. H03M 1/00; H03M 1/12
USPC .......................... 341/118, 120, 155, 121, 110
See application file for complete search history.

(56) References Cited

U.S. PATENT DOCUMENTS 6,950,044 B1 * 9/2005 Piasecki .............. H03M 1/0872
341/118

* cited by examiner

*Primary Examiner* — Joseph Lauture
(74) *Attorney, Agent, or Firm* — Tran & Associates

(57) ABSTRACT

A method of increasing SAR ADC conversion rate and reducing power consumption by employing a new timing scheme and minimizing timing delay for each bit-test during binary-search process. The high frequency clock input requirement is eliminated and higher speed rate can be achieved in SAR ADC.

16 Claims, 9 Drawing Sheets

HIGH SPEED SAR ADC USING COMPARATOR OUTPUT TRIGGERED BINARY-SEARCH TIMING SCHEME AND BIT-DEPENDENT DAC SETTLING

BACKGROUND

FIG. 1 shows the block diagram of a SAR (Successive Approximation Register) ADC with the elements of Track/Hold, Comparator, N-bit DAC and Binary Search Logic. The analog input voltage ($V_{IN}$) is sampled and held by Track/Hold. The Binary Search Logic is initially set to midscale (100 . . . 00). This forces the DAC output ($V_{DAC}$) to be $V_{REF}/2$, where $V_{REF}$ is the reference voltage of ADC. The Comparator compares $V_{IN}$ and $V_{DAC}$ and determines the next operation. If $V_{IN}$ is greater than $V_{DAC}$, the comparator output is logic high and the MSB of N-bit register remains at 1. Conversely, if $V_{IN}$ is less than $V_{DAC}$, the comparator output is logic low and the MSB is cleared to logic 0. This binary-search algorithm continues till LSB. The conversion is complete once LSB output is obtained.

The N-bit DAC can be implemented using current, resistor or capacitor. Capacitive DAC is commonly used because capacitive DAC provides an inherent track/hold function. A capacitive DAC consists of an array of N capacitors with binary or non-binary weighted values. Capacitive DAC employs the principle of charge redistribution to generate an analog output voltage.

FIG. 2 shows an example of a 14-bit capacitive binary weighted DAC and comparator in SAR ADC. During the acquisition phase, the common terminal is connected to AC ground and all the switches are connected to the input $V_{IN}$. After acquisition, the common terminal is disconnected from AC ground and all the switches connected to $V_{IN}$ are open. The $V_{IN}$ voltage is effectively sampled and stored on the capacitors. As the first step of binary-search algorithm, the bottom plate of MSB capacitor is connected to reference voltage $V_{REF}$. This drives the common terminal in the positive direction by an amount equal to $1/2V_{REF}$. The comparator will make a decision depending on $V_{IN}$ is greater or less than $1/2V_{REF}$. As the binary-search algorithm continues, the next smaller capacitor is connected to $V_{REF}$. This drives the common terminal by an amount of $1/4V_{REF}$. The binary-search algorithm continues until all the DAC capacitors are exercised. The relationship of $V_{IN}$ and ADC digital output is described in the following equation:

$$V_{IN} = B13 * \frac{V_{REF}}{2} + B12 * \frac{V_{REF}}{4} + \ldots + B1 * \frac{V_{REF}}{8192} + B0 * \frac{V_{REF}}{16384}$$

$V_{IN}$ is the ADC input voltage
B[13:0] is ADC outputs
$V_{REF}$ is ADC reference voltage
And the time required for N-bit SAR ADC to complete one conversion is:

$$T_{total} = T_{sample} + N * T_{bit-test}$$

$T_{sample}$ is the time needed for track/hold
$T_{bit-test}$ is the time needed for each bit-test
For conventional synchronous SARADC, each bit-test takes one clock cycle to finish. If track/hold takes M clock cycles to sample the input, then the total time of one conversion is M+N clock cycles. The relationship of ADC conversion rate and input clock rate can be described in the following equation:

ADC Conversion Rate=Clock Rate/(M+N)

For example, for 14-bit SAR ADC, if track/hold sample time needs 6 clock cycles, then 6+14=20 clock cycles is needed to finish one conversion. The input clock rate needs to be 2 GHz to obtain 100 MHz conversion rate. Such high frequency clock is usually not available in the system. For System-on-Chip (SoC), it is very desirable to obtain the same frequency conversion rate as other ADC architectures like Flash ADC or Pipelined ADC. Two developed methods will be presented below to enable high conversion rate SAR ADC and eliminate the requirement of high frequency clock input of SAR ADC.

SUMMARY

In one aspect, a high-speed SAR (Successive Approximation Register) ADC employs comparator output triggered timing scheme to eliminate higher frequency input requirement of the conventional SAR ADC. The timing delay during bit-to-bit binary-search process is reduced with respect to the corresponding DAC capacitor values to minimize the overall conversion time.

In another aspect, a finite-state machine for binary-search process to eliminate a high frequency clock input for a SAR (Successive Approximation Register) data converter includes a sample state to receive a sample, wherein the state resets a counter; a comparison state with a comparator-enable signal enables a comparator to compare an input voltage difference (EN_COMP) and a comparison-complete signal representing completion of a comparison (COMP_UPDATE); a data settling state wherein COMP_UPDATE clears EN_COMP, and then COMP_UPDATE is de-asserted; and a data conversion complete state until the counter is at a predetermined number indicating conversion is complete and ready for the next sample.

In a further aspect, a comparator triggered binary-search timing circuit, includes a flip-flop coupled to a sample trigger circuit; a bit-test trigger circuit; a clear logic; and a comparator forming a close loop to enable conversion and eliminate high frequency clock input requirement of a SAR (Successive Approximation Register) data converter.

Yet another aspect, a method of eliminating high frequency clock input in a SAR (Successive Approximation Register) data converter includes triggering a flip-flop with a delayed sample pulse from a comparator; triggering the flip-flop with a delayed bit-test pulse from the comparator; clearing the flip-flop with a delayed pulse from a comparator output; enabling the comparator and starting comparison with the flip-flop; and connecting the flip-flop and the comparator in a closed loop configuration with delay elements in the loop.

Implementations of the above aspect can include one or more of the following. A comparator and flip-flop, Sample Trigger, Bit-test Trigger and Clear Trigger circuitry forms a closed loop configuration to define different states of the binary-search process without input clock. The timing delay elements in Sample Trigger, Bit-test Trigger and Clear Trigger circuitry can be set individually with respect to the corresponding DAC capacitor value. Furthermore, the timing delay of the delay elements can be adjusted according to Process, Voltage and Temperature (PVT). Minimizing the delay for each bit results in the increase of SAR ADC conversion rate. Besides, the ADC power consumption is reduced due to the removal of high frequency clock input.

Advantages of the system may include one or more of the following. The method increases SAR ADC conversion rate and reducing power consumption by employing a new timing scheme and minimizing timing delay for each bit-test during binary-search process. The high frequency clock input requirement is eliminated and higher speed rate can be achieved in SAR ADC.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

Figure 1:
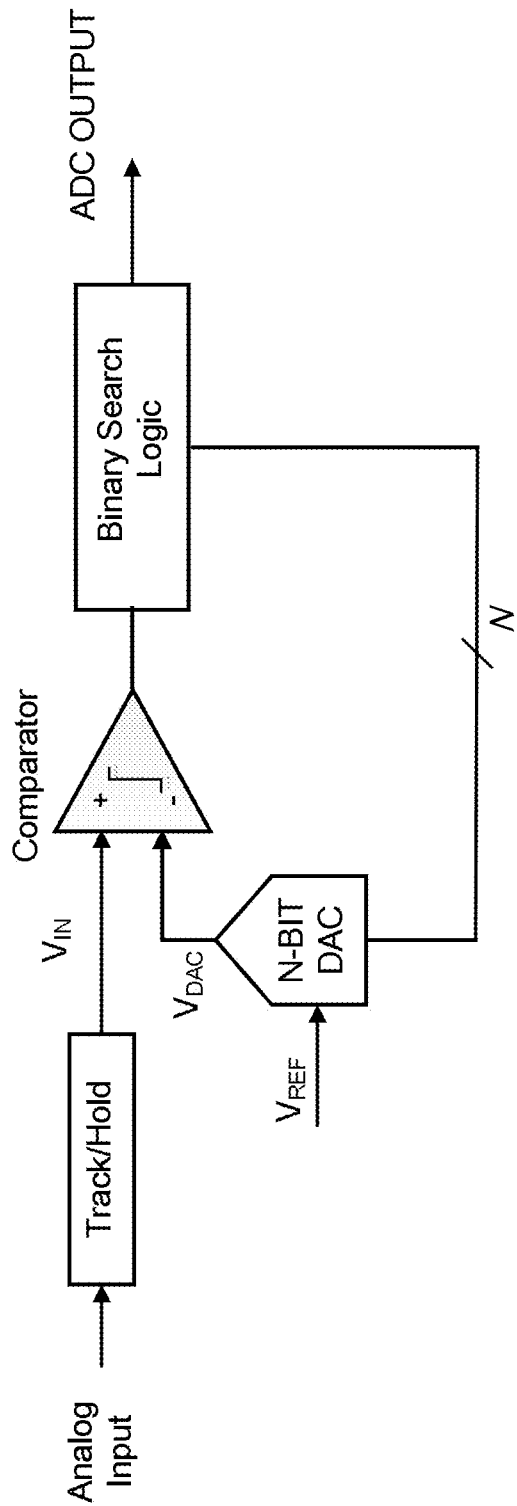
FIG. 1 shows a N-bit SAR ADC block diagram
Figure 2:
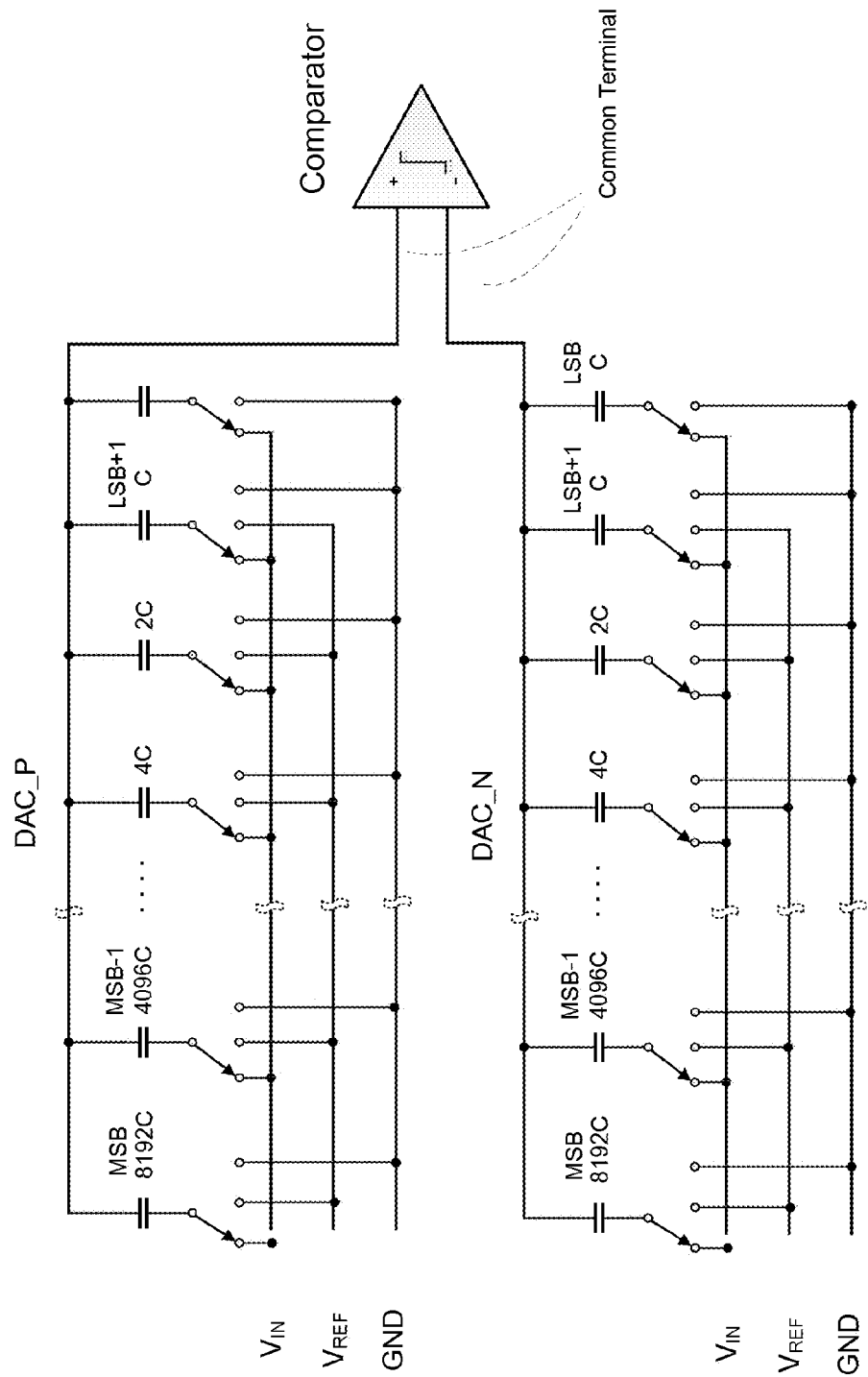
FIG. 2 illustrates a 14-bit capacitive DAC in SAR ADC

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 3:
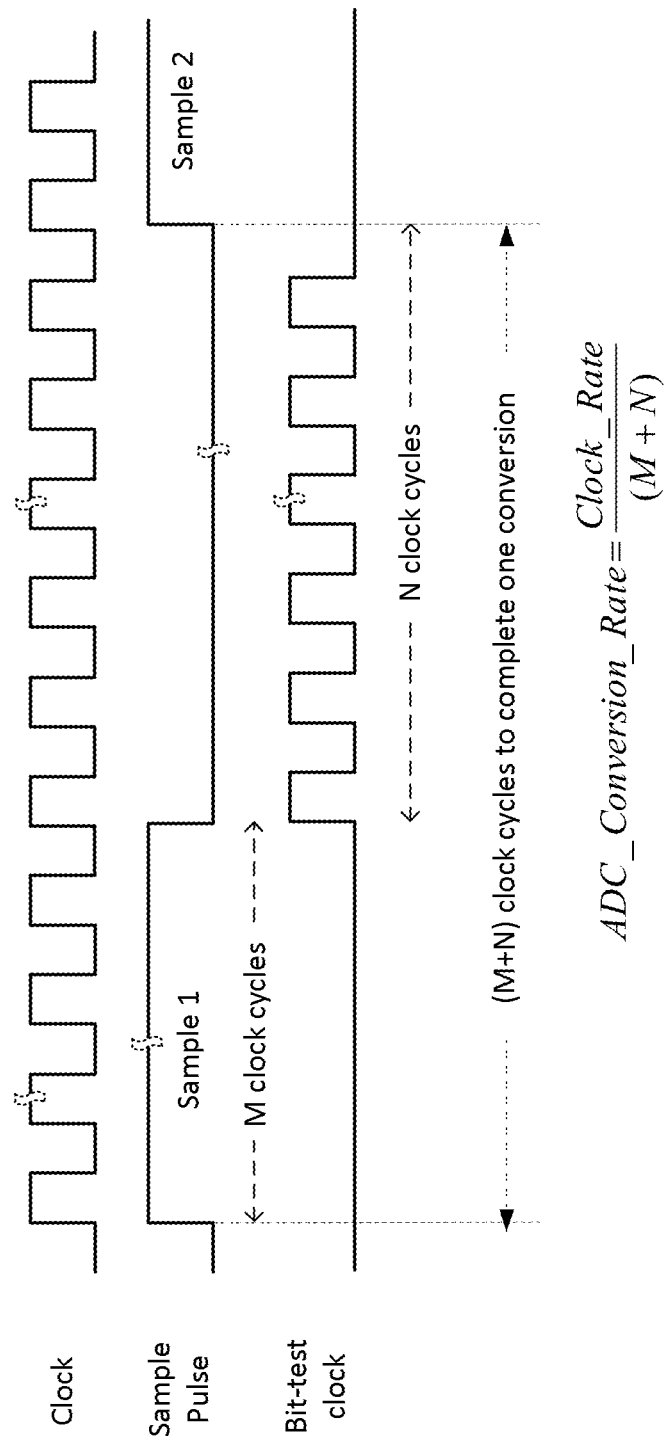
FIG. 3 illustrates the timing diagram of the conventional SAR ADC

FIG. 3 illustrates the timing diagram of conventional SAR ADC. The input sampling takes M clock cycles and each bit-test takes one clock cycle. For N-bit ADC, the total required time to complete one conversion is M+N clock cycles. For a specified ADC conversion rate, the input clock rate needs to be (M+N) times of the ADC conversion rate.

Figure 4:
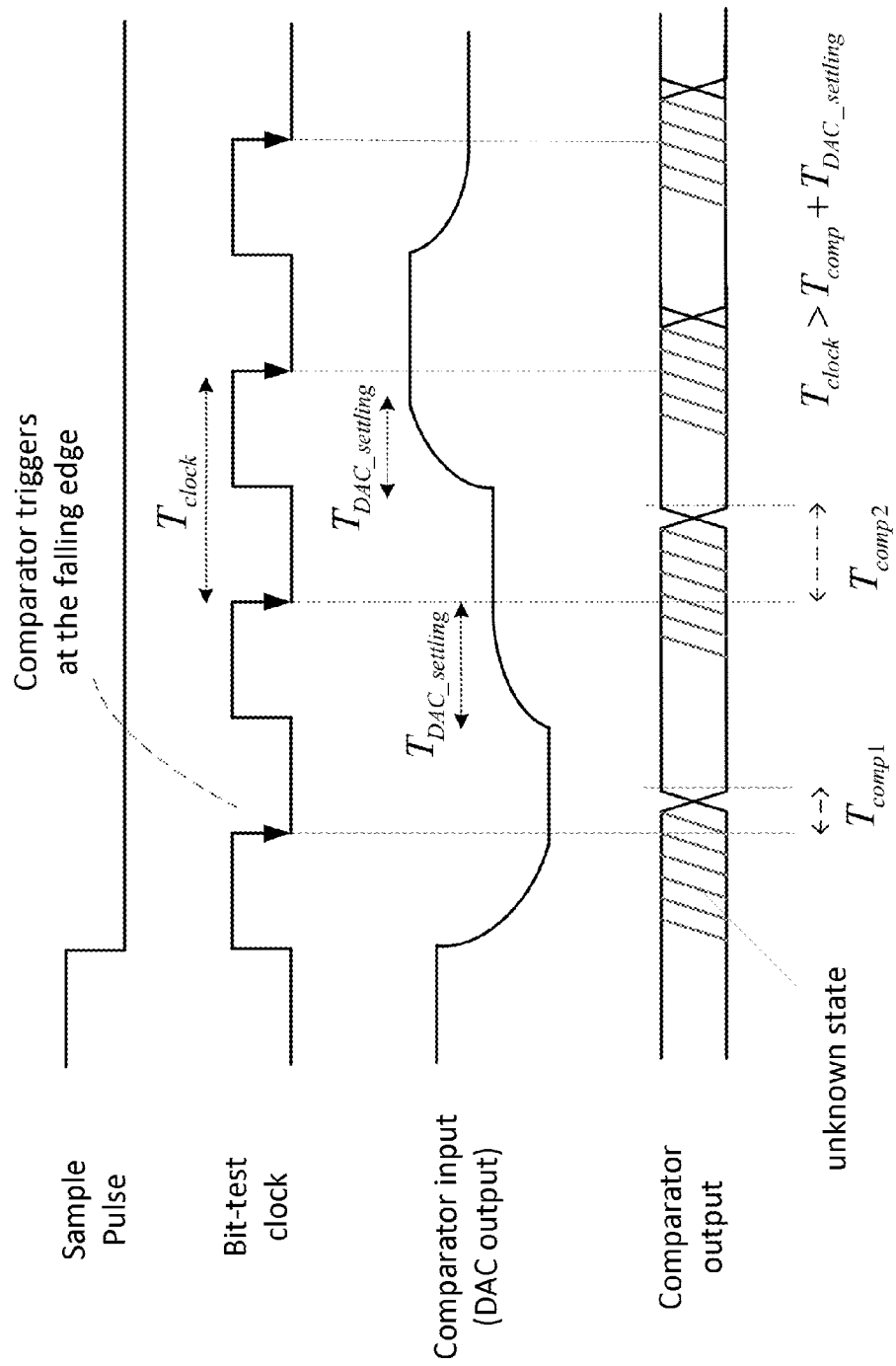
FIG. 4 shows the detailed timing of first 3 bit-tests of the conventional SAR ADC

FIG. 4 shows the detailed timing diagram for first 3 bit-tests and the associated comparator input and output waveforms for a conventional SAR ADC. Assume that the comparator is triggered on the falling edge of bit-test clock. The time that comparator result resolves depends on the comparator input voltage difference. For large input difference like first bit-test, the comparator result comes up very quickly in $T_{comp\_1}$. However, for small input difference like the $2^{nd}$ bit-test, the comparator result takes much longer time $T_{comp\_2}$ to resolve. The time $T_{comp\_2}$ is longer than $T_{comp\_1}$ as shown on FIG. 4. For each bit-test, the time required is primarily the sum of comparator delay time $T_{comp}$ and DAC settling time $T_{DAC\ settling}$. The timing relationship can be described as:

$$T_{clock} > T_{Comp} + T_{DAC\ settling}$$

$T_{clock}$ is the input clock period
$T_{comp}$ is the time required for comparator to resolve
$T_{DAC\ settling}$ is the time required for DAC to settle The equation states that the input clock period $T_{clock}$ has to be greater than the sum of comparator delay and DAC settling time, otherwise the performance like SNR or linearity will be degraded.

The conventional SAR scheme prior art mentioned above exists inefficiency and disadvantage for achieving higher conversion rate. Firstly, for the large input, the comparator resolves much quicker compared with the small input. The use of the one full clock cycle time for all the bit-tests is not optimal, which slows down the conversion rate. Secondly, the DAC settling time can be reduced as the binary-search goes from MSB toward LSB. Since MSB capacitor is much larger than LSB capacitor, the DAC settling time can be further reduced with respect to each individual bit.

Comparator output triggered SAR binary-search timing scheme has been developed to eliminate the requirement of high frequency clock input and further increase the conversion rate of SAR ADC. First a finite-state machine is needed to replace the process steps operated and driven by a synchronous clock of conventional SAR ADC. There require different states including Sample, Comparison, DAC settle and Conversion Complete for a binary-search process.

Figure 5:
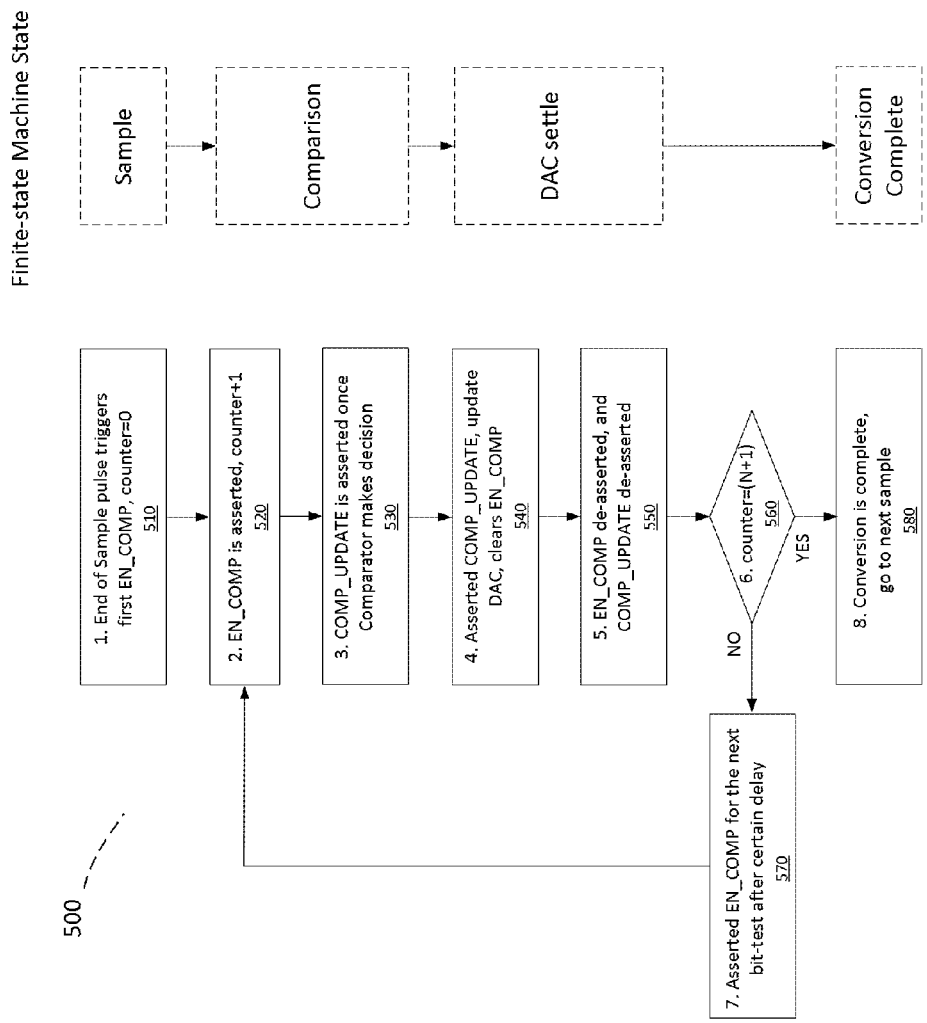
FIG. 5 is the finite-state machine flowchart of the instant comparator output triggered binary-search timing scheme

FIG. 5 is the flowchart of finite-state machine design that accomplishes the different states mentioned above for binary-search in SAR ADC. There are two index signals EN_COMP and COMP_UPDATE. The different states and state transition is fully defined and specified by these two index signals. Signal EN_COMP represents the situation that comparator is enabled and comparator starts comparing the input voltage difference. Signal COMP_UPDATE represents that comparator finishes the comparison and the comparison result is ready for use. The binary-search process starts with step 510 where end of the sample pulse triggers the first EN_COMP. The counter is reset zero initially. Once EN_COMP is asserted, the counter adds one and then COMP_UPDATE is asserted after comparator makes decision at step 530. The asserted COMP_UPDATE clears EN_COMP, and COMP_UPDATE is de-asserted as well after some delay at step 550. The decision step 560 checks the counter and goes back to step 520 if the counter is smaller than N+1. When all the N bit-test is finished, the counter equals N+1, the conversion is complete and the process proceeds to the next sample. The corresponding states of the finite-state machine are listed on the right side of FIG. 5.

Figure 6:
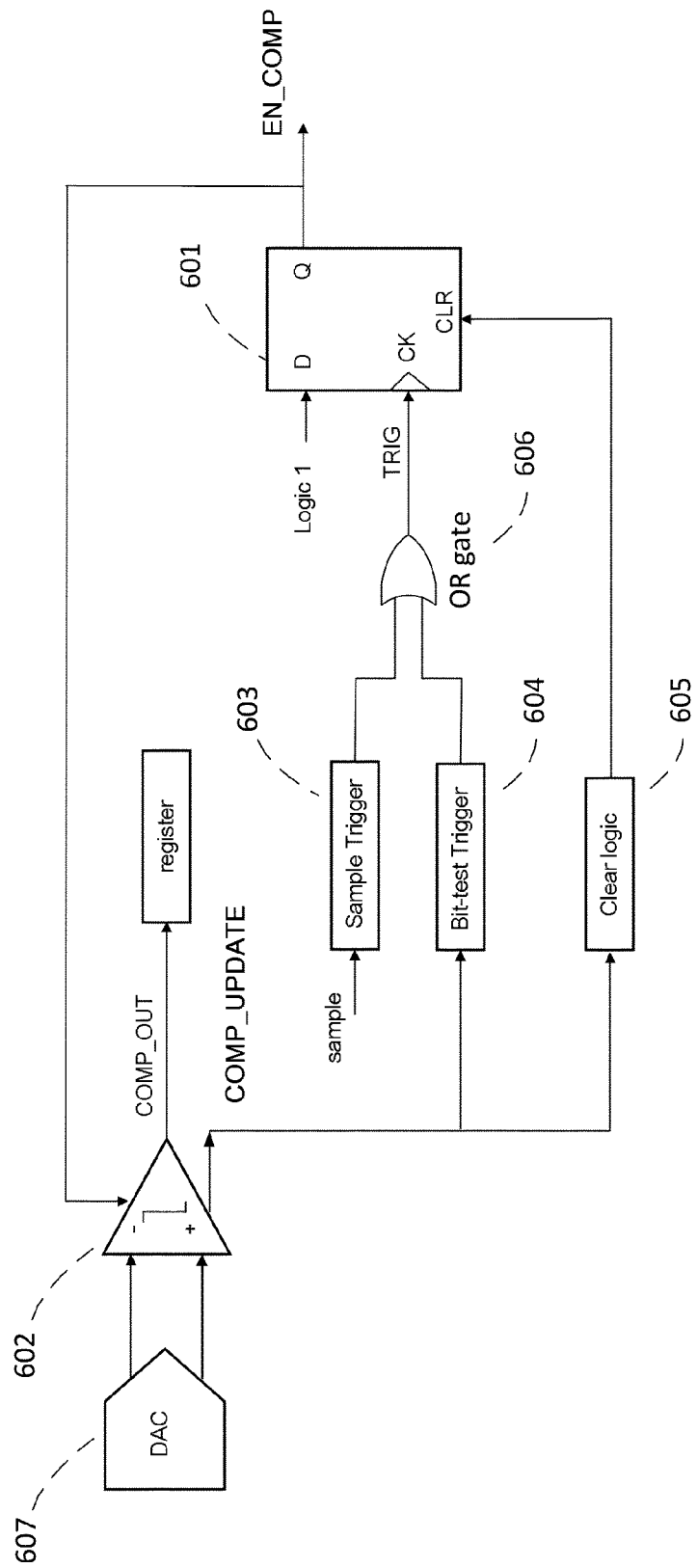
FIG. 6 is the implementation of comparator triggered binary-search timing scheme

FIG. 6 shows the implementation of the finite-state machine described on FIG. 5. It consists of flip-flop 601, Comparator 602, Sample Trigger 603, Bit-test Trigger 604, Clear Logic 605, OR gate 606 and DAC 607. Comparator's output COMP_UPDATE is connected to flip-flop through Bit-test Trigger or Clear Logic and flip-flop's output EN_COMP is connected back to comparator forming a closed-loop configuration. The index signals EN_COMP is the output of flip-flop 601 and also the input of Comparator 602. The other index signal COMP_UPDATE is the comparator output that represents the comparison is finished and the output result appears on comparator output signal COMP_OUT. Sample Trigger, Bit-test Trigger and Clear logic consist of timing delay elements and pulse generation.

flip-flop 601 is first triggered through the Sample Trigger path 603 then through Bit-test Trigger path 604. An OR gate 606 collects these two paths and the output of OR gate is connected to CK pin of flip-flop. Sample Trigger 603 represents the first EN_COMP scenario at end of the sample pulse as described on FIG. 5 step 510. Bit-test Trigger 604 represents the N bit-test process as described on FIG. 5 steps 520 to 570. Once the signal TRIG is raised to logic high, flip-flop's output EN_COMP will be asserted. Comparator 602 starts comparing the input difference then COMP_UPDATE is asserted once decision is made after a certain time delay. The asserted COMP_UPDATE proceeds and clears the Flip Flop through Clear Logic 605 as described on FIG. 5 step 540. Bit-test Trigger 604 executes N time binary-search function from MSB to LSB. The other comparator output COMP_OUT is connected to registers which store the comparator's result of each bit-test.

Figure 7:
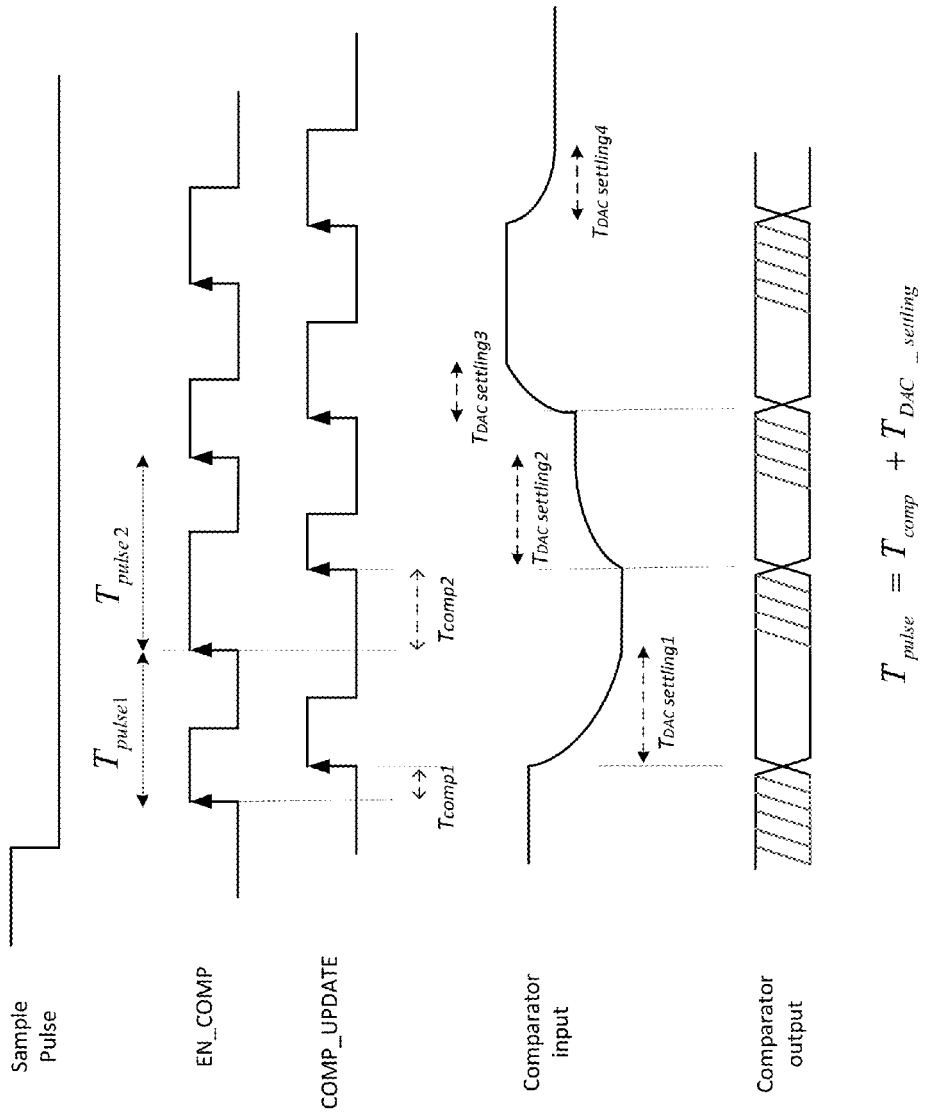
FIG. 7 illustrates the timing diagram of comparator triggered binary-search timing scheme

FIG. 7 illustrates the timing diagram of the developed comparator output triggered binary-search timing scheme. There is no fixed frequency clock in the timing diagram. The state transition is governed by the two index signals EN_COMP and COMP_UPDATE. Each bit-test is triggered by rising index signal EN_COMP, once EN_COMP is asserted, the comparator starts comparing the input and the other index signal COMP_UPDATE is asserted once the comparator make decision after a timing delay $T_{comp}$. The comparator result is stored in the registers and DAC inputs are updated and exercised based on the new DAC value. The updated DAC output is the input of the comparator as shown on FIG. 6. DAC output reaches a settled state after a time delay $T_{DAC\ settling}$. The next EN_COMP is arranged to come up for the next bit-test after a delay time specified in Bit-test Trigger.

For large input, the comparator resolves quickly and proceeds to the next bit-test directly. Whereas for the small input, the comparator takes much longer time to reach decision. This timing difference is observed on the variation of EN_COMP signal pulse width on FIG. 7. Each bit-test time is the sum of comparator delay and DAC settling time. The timing relationship of this comparator triggered timing scheme can be described in the following equation:

$$T_{pulse} = T_{bit-test} = T_{Comp} + T_{DAC\ settling}$$

$T_{pulse}$ is EN_COMP pulse width for each bit-test
$T_{bit-test}$ is the time required for each individual bit-test
$T_{comp}$ is the time required for comparator to resolve
$T_{DAC\ settling}$ is the time required for DAC to settle The above equation states that EN_COMP pulse width $T_{pulse}$ is exactly the time required for each bit-test $T_{bit-test}$. Since bit to bit transition is triggered by the comparator output instead of fixed clock sequence like in the conventional SAR ADC, the binary-search algorithm moves straight to the next bit once the comparator resolves without any waiting or delay. This comparator output triggering mechanism doesn't require a faster input clock and also result in a much faster ADC conversion.

The major limitations of SAR conversion speed are DAC settling time and comparator delay. DAC settling time is determined by the time constant of each DAC capacitor bit. Time constant is the product of effective capacitance and resistance value at each capacitor node. Larger time constant requires more time to settle.

In this comparator triggered timing scheme, the delay time for each bit-test is controlled and specified by Bit-test Trigger 604 on FIG. 6. To further speed up the conversion, DAC settling time can be optimized based on the capacitor value. Since MSB has the maximum capacitor value while LSB has the minimum capacitor value, the settling time can be reduced from MSB toward LSB to match the decreasing time constant during binary-search process.

Figure 8:
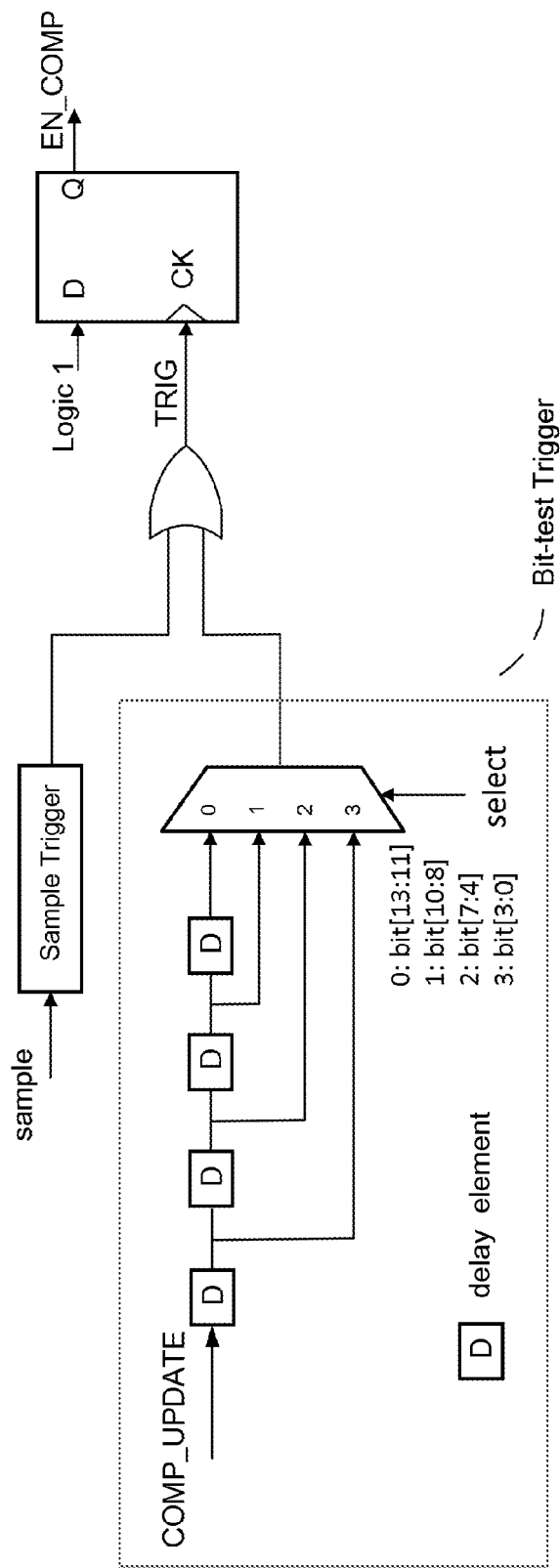
FIG. 8 shows the bit-dependent delay implementation using multiplexer

FIG. 8 shows the bit-dependent delay implementation using multiplexer. For MSB bit 13 to bit 11, four delay elements are used. For bit 10 to bit 8, three delay elements are used. For bit 7 to bit 4, two delay elements are used. For bit 3 to LSB, only one delay element is used. The path delay keeps reducing from MSB toward LSB to match the corresponding decreasing capacitor value or time constant. This reduces the overall conversion time and results in a faster ADC.

Figure 9:
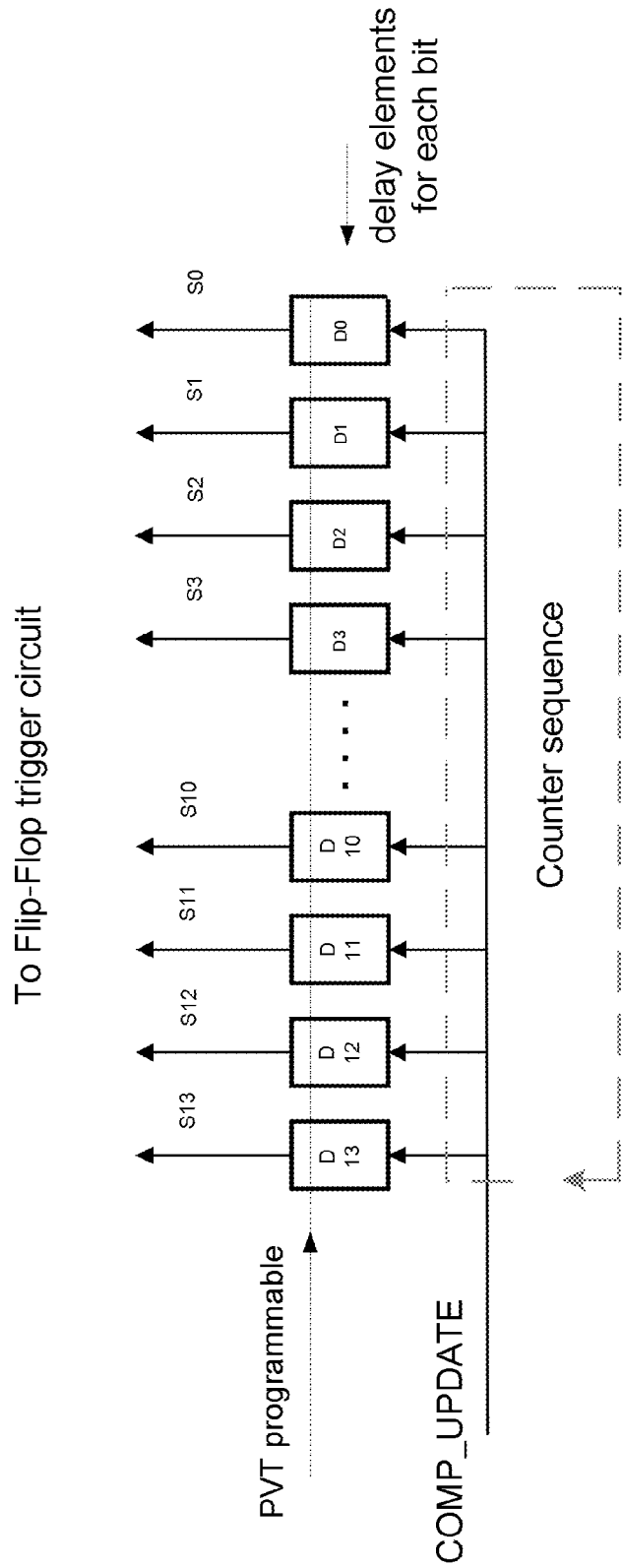
FIG. 9 shows the bit-dependent delay implementation using counter based delay control with PVT programmability

FIG. 9 shows another counter based bit-dependent delay control. Only Bit-test Trigger path is shown in this figure. Each bit has different optimized delay elements from D13 to D0. Signal COMP_UPDATE goes through corresponding delay for each bit respectively when counter starts from MSB to LSB during binary-search process. Only one of the delayed signals S13 to S0 is enabled and passed to the flip-flop trigger circuit. This arrangement minimizes the overall conversion time and achieves a faster ADC speed. Furthermore, the delay elements in Bit-test Trigger can be programmed and adjusted to track the process, voltage and temperature (PVT) condition so ADC can achieve optimal performance across PVT corners.

The instant comparator output triggered timing scheme does not require a faster input clock. ADC sample rate can be as high as the given clock rate as long as the sum of the sampling time and the binary-search time can be completed within one clock cycle. Since MSB transition represents the largest excursion of the DAC output, by reducing the delay with respect to corresponding bit's DAC's settling time, the conversion rate of SAR ADC can be enhanced. Compared with using identical cycle of conventional clock scheme, the developed method executes the next comparison upon completion of each bit. This leads to a much faster ADC conversion speed. Moreover, this approach eliminates the need for internal clock and related buffer, power saving is also obtained.

What is claimed is:
1. A finite-state machine for binary-search process to eliminate a high frequency clock input for a SAR (Successive Approximation Register) data converter, comprising:
 a sample state to receive a sample, wherein the state resets a counter;
 a comparison state with a comparator-enable signal enables a comparator to compare an input voltage difference (EN_COMP) and a comparison-complete signal representing completion of a comparison (COMP_UPDATE);

a data settling state until COMP_UPDATE clears EN_COMP, and then COMP_UPDATE is de-asserted; and a data conversion complete state when the counter is at a predetermined number indicating conversion is complete and ready for the next sample.

2. A finite-state machine of claim 1, wherein the signals EN_COMP and COMP_UPDATE represent different states and define state transition.

3. A comparator triggered binary-search timing circuit, comprising:
a flip-flop;
a sample trigger circuit coupled to the flip-flop;
a bit-test trigger circuit coupled to the flip-flop;
a clear logic coupled to the flip-flop; and
a comparator forming a close loop with the flip-flop to enable conversion and eliminate high frequency clock input requirement of a SAR (Successive Approximation Register) data converter.

4. The comparator triggered binary-search timing circuit of claim 3, wherein flip-flop is asserted either by the sample pulse through sample trigger path or by the comparator output through bit-test trigger path, wherein sample trigger and bit-test trigger consist of timing delay elements.

5. The comparator triggered binary-search timing circuit of claim 3, wherein the comparator output signal is connected to Clear logic to clears flip-flop, and flip-flop output is connected back to comparator to enable the start of the comparison, wherein clear logic consists of timing delay element.

6. The comparator triggered binary-search timing circuit of claim 3, wherein bit-test trigger timing delay is bit-dependent with respect to the corresponding DAC bit capacitor values to minimize the conversion time during binary-search process.

7. The comparator triggered binary-search timing circuit of claim 6, comprising a multiplexer to select different timing delay for different bit-test during a binary-search to reduce conversion time.

8. The comparator triggered binary-search timing circuit of claim 6, comprising a counter to select individual optimized delay for each bit to reduce timing delay during a SAR binary-search for fast conversion.

9. The comparator triggered binary-search timing circuit of claim 6, comprising a delay element with programmed timing based on Process, Voltage and Temperature (PVT) to optimize data converter performance over PVT corners.

10. A method of eliminating high frequency clock input in a SAR (Successive Approximation Register) data converter, comprising:
triggering a flip-flop with a delayed sample pulse from a comparator;
triggering the flip-flop with a delayed bit-test pulse from the comparator;
clearing the flip-flop with a delayed pulse from a comparator output;
enabling the comparator and starting comparison with the flip-flop; and
connecting the flip-flop and the comparator in a closed loop configuration with delay elements in the loop.

11. The method of claim 10, comprising forming a close loop configuration using the flip-flop, the comparator, a sample trigger, a bit-test trigger and a clear logic, wherein the sample trigger, bit-test trigger and clear logic includes delay elements to control timing delay.

12. The method of claim 10, wherein the flip-flop is asserted either by the sample pulse through sample trigger path or by the comparator output through bit-test trigger path, and wherein the flip-flop is cleared through Clear logic path.

13. The method of claim 10, wherein the bit-test trigger timing delay is bit-dependent with respect to a corresponding data converter bit capacitor values to minimize conversion time during a binary-search.

14. The method of claim 13, comprising selecting different timing delay with a multiplexer for different bit-test during binary-search to reduce conversion time.

15. The method of claim 13, comprising selecting individual optimized delay with respect to each bit with a counter to reduce timing delay during SAR binary-search process.

16. The method of claim 13, comprising programming the timing delay of a delay element based on Process, Voltage and Temperature (PVT) to optimize data converter performance over PVT corners.

* * * * *